(12) United States Patent
Zhang et al.

(10) Patent No.: US 9,941,883 B2
(45) Date of Patent: Apr. 10, 2018

(54) TRANSMISSION GATE CIRCUIT

(71) Applicant: FREESCALE SEMICONDUCTOR, INC., Austin, TX (US)

(72) Inventors: Wenzhong Zhang, Tianjin (CN); Michael A. Stockinger, Austin, TX (US)

(73) Assignee: NXP USA, INC., Austin, TX (US)

( * ) Notice: Subject to any disclaimer, the term of this patent is extended or adjusted under 35 U.S.C. 154(b) by 343 days.

(21) Appl. No.: 14/887,271

(22) Filed: Oct. 19, 2015

(65) Prior Publication Data

US 2016/0294378 A1 Oct. 6, 2016

(30) Foreign Application Priority Data

Apr. 3, 2015 (CN) .......................... 2015 1 0325845

(51) Int. Cl.
*H03K 19/0185* (2006.01)
*H03K 5/08* (2006.01)

(52) U.S. Cl.
CPC ....... *H03K 19/018521* (2013.01); *H03K 5/08* (2013.01)

(58) Field of Classification Search
CPC .................. H03K 19/018521; H03K 5/08
See application file for complete search history.

(56) References Cited

U.S. PATENT DOCUMENTS

| 4,930,037 | A | 5/1990 | Woo |
| 6,097,238 | A | 8/2000 | Zhou |
| 6,127,855 | A | 10/2000 | Taft et al. |
| 6,462,611 | B2 | 10/2002 | Shigehara et al. |
| 6,794,914 | B2 | 9/2004 | Sani et al. |
| 6,795,369 | B2 | 9/2004 | Choi et al. |
| 6,834,336 | B2 | 12/2004 | Takayama et al. |
| 6,975,271 | B2 | 12/2005 | Adachi et al. |
| 7,208,978 | B2 | 4/2007 | Uno |
| 7,286,001 | B2 | 10/2007 | Nakatsuka et al. |
| 7,514,983 | B2 | 4/2009 | Miske |
| 8,228,109 | B2 | 7/2012 | Stockinger et al. |
| 8,519,771 | B1* | 8/2013 | Cical .................... H03K 17/687 327/108 |
| 8,901,985 | B2 | 12/2014 | Kurokawa |
| 2011/0316610 | A1* | 12/2011 | Stockinger ........... H03K 17/102 327/437 |
| 2013/0321070 | A1* | 12/2013 | Gagne ..................... G05F 1/12 327/538 |

* cited by examiner

*Primary Examiner* — Scott Bauer
(74) *Attorney, Agent, or Firm* — Charles E. Bergere

(57) ABSTRACT

A transmission gate circuit includes a pass gate and a control circuit and provides High Voltage protection to a flash memory in a characterization mode and a low resistive path with true open-drain functionality in a normal mode. A native NMOSFET in series with the pass gate provides overvoltage protection for additional circuitry. Well biasing, gate tracking and internal node clamping circuits ensure that all of the devices of the pass gate and control circuit operated within safe operational voltage levels. The two modes of operation can be selected by an enable signal. The transmission gate circuit can support up to a 5.5 volts input in a true open drain mode while an input/output supply voltage of 3.3 volts is supplied.

19 Claims, 4 Drawing Sheets

… (1)

TRANSMISSION GATE CIRCUIT

BACKGROUND

The present invention relates generally to voltage protection devices and particularly to transmission gate circuits used to selectively enable or disable a current path in electronic circuitry.

FIG. 1 is a block diagram of an integrated circuit 100 that includes a non-volatile flash memory 101 and other circuitry 102. The integrated circuit 100 also typically includes a number of pads for providing power supply voltages (e.g., VDD, VSS) to the integrated circuit and for conveying I/O signals between the integrated circuit 100 and external circuitry (not shown). In FIG. 1, just two pads 103 and 104 are shown as examples. An I/O (Input/Output) pad 103 can be used to provide both power to the flash memory 101 for programming or erasing flash memory cells and an I/O signal to the circuitry 102. The circuitry 102 typically includes MOS (metal oxide semiconductor) devices. An "I/O signal" can be an input signal, an output signal, or both an input signal and an output signal. "MPPAD" refers to a signal line 105 of the integrated circuit 100 that is connected between the I/O pad 103 and the circuitry 102 by way of transmission gate circuitry 106. In a flash characterization mode, when the I/O pad 103 receives a supply voltage for programming or erasing the flash memory 101, the I/O pad voltage may be set as high as 15 Volts, for example. For in/out and pull up/down paths of the circuitry 102, the maximum safe operating voltage is 3.6 Volts, in this example. For devices used in the transmission gate 106, the maximum safe operating voltage is 9 Volts, in this example. The level of I/O pad voltage could therefore damage the gate oxide and the source/drain junctions of the MOS devices of the circuitry 102 and the transmission gate circuitry 106 if no appropriate protection were provided. In the normal input/output mode of the integrated circuit 100 however, a low resistive path between the I/O pad 103 and the circuitry 102 is required. The transmission gate circuitry 106 and an associated voltage bias generation circuit 107 are provided between the I/O pad 103 and the circuitry 102 and arranged to isolate the circuitry 102 from the pad 103 to prevent damage when operating in flash characterization mode and to be conductive when the pad 103 is coupled to external circuitry to provide and receive an I/O signal.

FIG. 2 is a schematic circuit diagram of the transmission gate circuitry 106. The transmission gate circuitry 106 includes two serially connected transmission gates 201 and 203 that are connected between the MPPAD signal line 105 and the circuitry 102 of FIG. 1. The transmission gate circuitry 106 also includes a first PMOS control circuit 211 for controlling the conductivity of a first PMOS transistor 207 and a second PMOS control circuit 213 for controlling the conductivity of a second PMOS transistor 209. The transmission gate circuitry 106 also includes self-enabling circuitry 214 for enabling the first and second PMOS control circuits 211 and 213. The first PMOS control circuit 211 includes a PMOS transistor 215 having a body biased at VBIAS, a gate biased at VBIAS2, and a source coupled to the MPPAD signal line 105. The first PMOS control circuit 211 also includes an isolated NMOS transistor 217 having an N-Well biased at VBIAS, a drain connected to the gate of the first PMOS transistor 207 and the drain of the PMOS transistor 215, a body tied to its source, and a gate biased at VBIAS2. The first PMOS control circuit 211 also includes an NMOS transistor 219 having a body tied to its source, which is connected to VSS (ground), a drain connected to the source of the isolated NMOS transistor 217, and a gate controlled by an enable signal EN. The second PMOS control circuit 213 receives the enable signal EN and the bias signal VBIAS2. The transmission gate circuitry 106 acts to provide, in a first operating mode, a conductive path between the MPPAD signal line and a terminal (I/O SIGNAL) of the circuitry 102 and in a second operating mode, acts to isolate the circuitry 102 from the pad 103. The relative values of the MPPAD voltage, the bias voltages, VBIAS, VBIAS2 and supply voltage VDD and the state of the enable signal EN, determine the operating mode.

The transmission gate circuitry 106 does have some drawbacks, however. Many integrated circuit products require the transmission gate circuitry to support a true open drain mode of operation at the I/O pad, that is, receiving a relatively high input voltage of up to 5.5 Volts typically, while the I/O supply voltage VDD, is at a lower level, for example, between 1.7 Volts and 3.6 Volts. The transmission gate circuitry shown in FIG. 2 cannot support a true open drain mode of operation. This is because when the transmission gate circuitry 106 is in the first operating mode and providing a conductive path between the MPPAD signal line and the circuitry 102, with MPPAD at a higher voltage than VDD (open drain mode), the NMOS transistors 217 and 219 will try to pull the gate of the first PMOS transistor 207 to VSS (nominal ground) while the PMOS transistor 215 will try to pull the gate of the first PMOS transistor 207 to MPPAD (with the MPPAD voltage being higher than VBIAS2). This would cause signal contention issues and significant current being drawn from MPPAD.

Thus it would be advantageous to provide a transmission gate circuit that supports an open drain mode.

BRIEF DESCRIPTION OF THE DRAWINGS

The invention, together with objects and advantages thereof, may best be understood by reference to the following description of preferred embodiments together with the accompanying drawings in which.

DETAILED DESCRIPTION OF PREFERRED EMBODIMENTS

Figure 1:
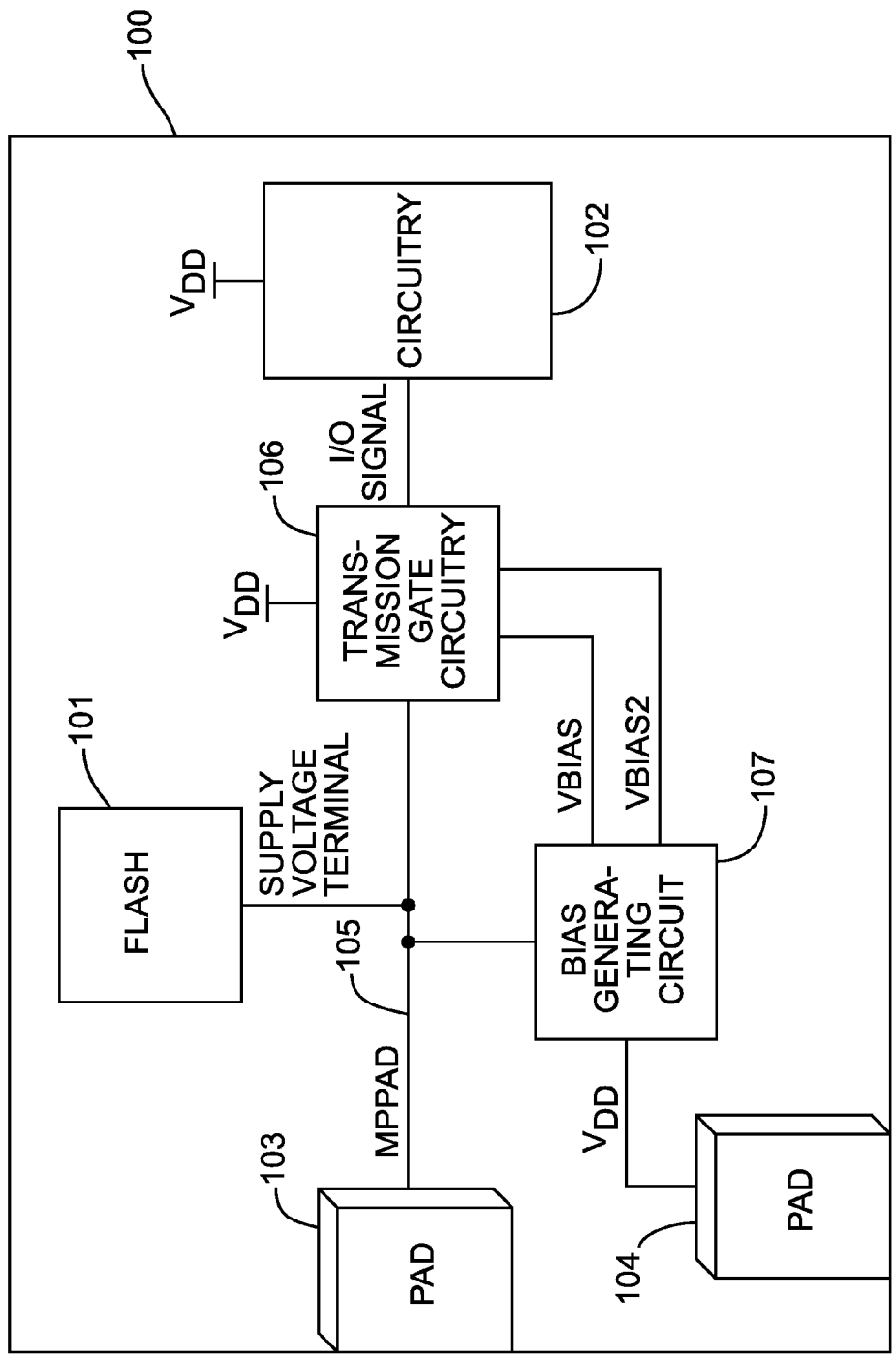
FIG. 1 is a schematic block diagram of a conventional integrated circuit including transmission gate circuitry.
Figure 2:
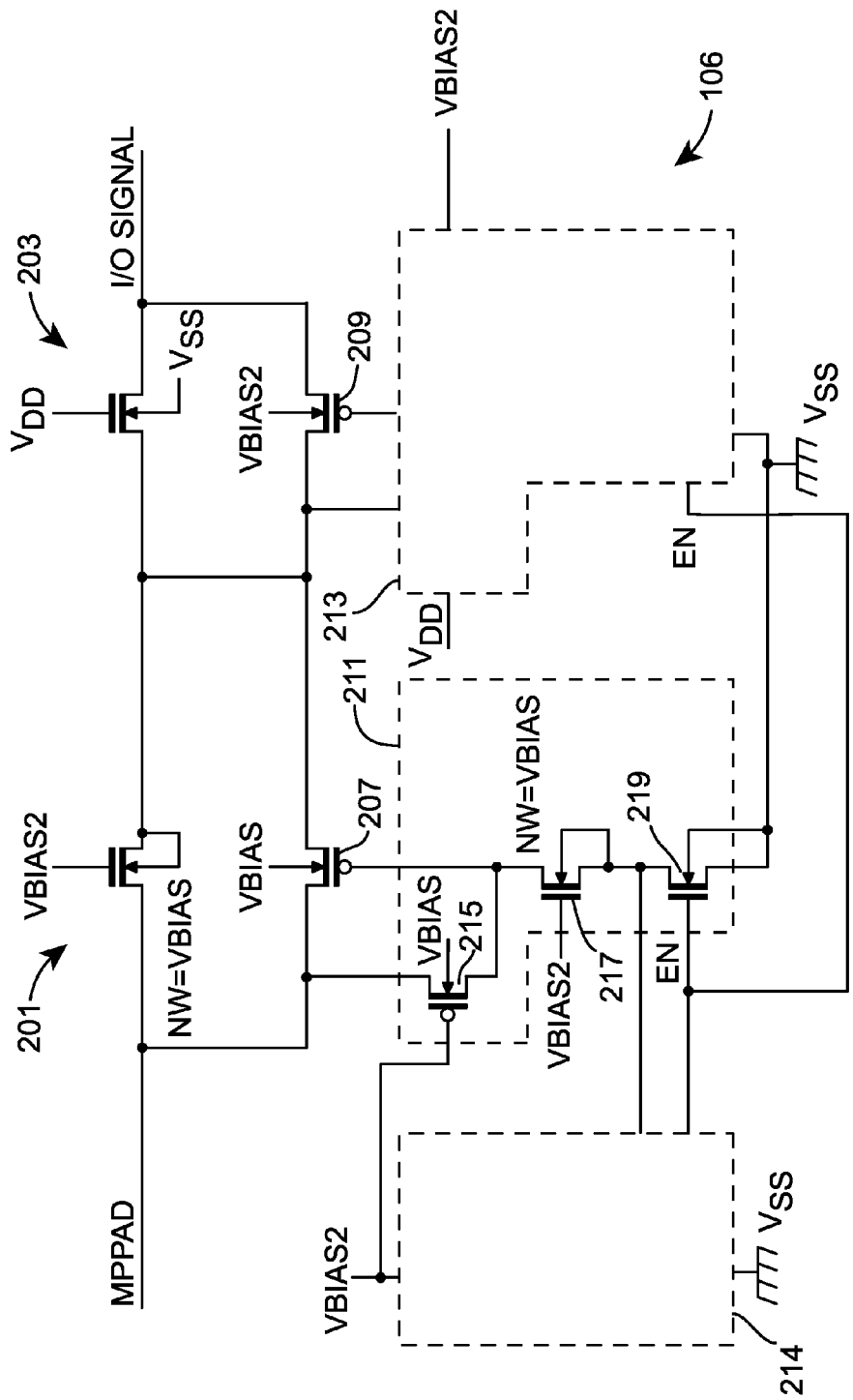
FIG. 2 is a schematic circuit diagram of a conventional transmission gate circuit.

The detailed description set forth below in connection with the appended drawings is intended as a description of presently preferred embodiments of the invention, and is not intended to represent the only forms in which the present invention may be practiced. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, a transmission gate circuit is provided that includes an input node and an output node, a first switching device, a switching stage, and a second switching device. The first switching device has a first electrode coupled to the input node, a second electrode coupled to a nodal point, and a control electrode. The switching stage has a first electrode coupled to the control electrode of the first switching device, a control electrode for receiving a first control signal, and a second electrode for connection to a first reference voltage. The second switching device has a first electrode coupled to the control electrode of the first switching device, a second electrode for receiving a first bias voltage, and a third electrode for receiving a second control signal. When the first and second control signals are in a first state, the second switching device is off and the switching stage is on, pulling the control electrode of the first switching device to a first reference voltage VSS, and turning on the first switching device, which thereby provides a conductive path between the input node and the nodal point. When the first and second control signals are in a second state, the switching stage is off and the second switching device is on, pulling the control electrode of the first switching device to the first bias voltage, thereby putting the first switching device in a non-conductive state.

Advantageously, the transmission gate circuit can be over-voltage tolerant. That is, it can tolerate, at an input pad, a voltage that is higher than the safe operating voltage of the individual devices used to form the transmission gate circuit and be capable of open drain operation at the same time. In one embodiment, this is achieved by providing stacked MOSFET (Metal Oxide Semiconductor Field Effect Transistor) stages throughout the circuit and by level-shifting an enable signal into a biasing voltage domain (which is derived from the input pad voltage and a supply voltage or other reference voltage higher than the supply voltage) for controlling the gate of a PMOSFET.

In one example, the transmission gate circuit includes a protection device. The protection device comprises a third switching device having a first electrode for coupling to the output node, a second electrode coupled to the nodal point, and a control electrode for receiving a supply voltage. The protection device provides a conductive path between the nodal point and the output node when the voltage at the nodal point is at or below the supply voltage and isolating the nodal point from the output node when the voltage at the nodal point is above the level of the supply voltage. The protection device may be a native (or natural) transistor.

Advantageously, the transmission gate circuit can provide high voltage protection in a flash high voltage characterization mode and low resistive path/true open-drain functionality in a normal mode. In some example embodiments, well biasing, gate tracking and internal node clamping circuits ensure that all of the MOS transistors of the transmission gate circuit are operated within their safe operation voltage range (for example, 9 Volts) in both conducting and isolating modes of operation of the transmission gate circuit. In the conducting mode, the pass gate is completely "on" providing a low resistive path. The additional native transistor can advantageously provide over-voltage protection to circuitry connected to the output of the transmission gate circuit and powered by a 3.3 Volt supply, for example. The two modes of operation can be selected with an enable signal.

Figure 3:
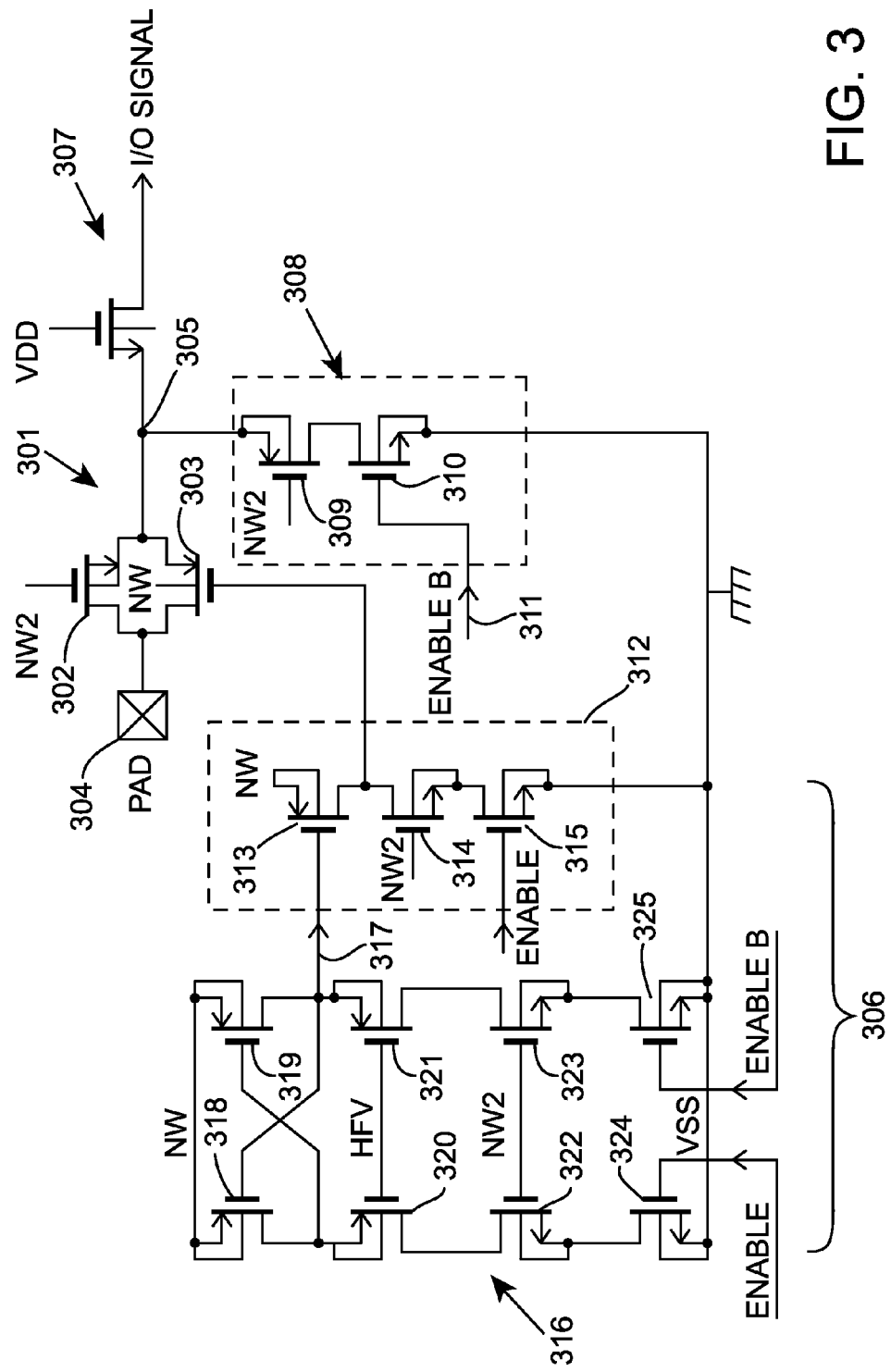
FIG. 3 is a schematic circuit diagram of transmission gate circuit in accordance with one embodiment of the present invention.

Referring now to FIG. 3, a transmission gate circuit in accordance with an embodiment of the present invention is shown. The transmission gate circuit may be incorporated into an integrated circuit such as that illustrated in FIG. 1. The transmission gate circuit includes a pass gate (or transmission gate) 301. The pass gate 301 comprises a first NMOSFET (N-channel metal oxide semiconductor field effect transistor) 302 and a first PMOSFET (P-channel metal oxide semiconductor field effect transistor) 303. A gate terminal of the first NMOSFET 302 is tied to a second bias voltage NW2. A drain terminal of the first NMOSFET 302 is connected to a drain terminal of the first PMOSFET 303 and both drain terminals are connected to a pad 304. A source terminal of the first NMOSFET 302 is connected to a source terminal of the first PMOSFET 303 and both source terminals are connected to a nodal point 305. A gate terminal of the first PMOSFET 303 is connected to an output of a gate biasing circuit 306. A body terminal of the first NMOSFET 302 is connected to its source terminal. A body terminal of the first PMOSFET 303 is biased at a first bias voltage NW.

In one mode of operation, the gate of the first NMOSFET 302 and the gate of the first PMOSFET 303 are biased so that the pass gate 301 is put into a conductive state and consequently acts as a low resistance path, allowing current to flow from the pad 304 to the nodal point 305. In another mode of operation the gate of the first NMOSFET 302 and the gate of the first PMOSFET 303 are biased so that the pass gate 301 is put into a non-conductive state and consequently the pass gate 301 isolates the nodal point 305 from the pad 304. In a preferred embodiment, the first bias voltage NW is approximately equal to the PAD voltage or the power supply voltage VDD, whichever is higher. In that same embodiment, the second bias voltage NW2 equals approximately half of the PAD voltage or the power supply voltage VDD, whichever is higher.

The transmission gate circuit of FIG. 3 is stacked by the provision of a second NMOSFET 307 whose source terminal is connected to the nodal point 305 and whose drain terminal serves as an output (I/O SIGNAL) of the transmission gate circuit and an input to other devices or circuitry (not shown). A gate terminal of the second NMOSFET 307 is connected to the power supply voltage VDD which may, for example, be 3.3 Volts. In one embodiment, the second NMOSFET 307 is a native NMOSFET device with a threshold voltage at zero Volts or nearly zero Volts. Hence this native NMOSFET device 307 is already weakly turned on if its gate-source bias voltage is at around 0 Volts. With its gate terminal connected to VDD, as in the example of FIG. 3, the second NMOSFET 307 limits the voltage at the output of the transmission gate circuit to approximately the VDD voltage, for example 3.3 Volts. The second NMOSFET 307 provides a conductive signal path between the nodal point 305 and the output of the transmission gate if the voltage at the nodal point 305 is at or below VDD and makes this path non-conductive if the voltage at the nodal point 305 is above VDD. The second NMOSFET 307 therefore provides over-voltage protection for other devices or circuitry that may be connected to its drain terminal and operating at a voltage equal to VDD, (e.g., 3.3 Volts)

In one application of the transmission circuit of FIG. 3, the pad 304 may carry a voltage of up to 15 Volts for a flash memory and may also act as an input pad for input signals to be received by the other devices or circuitry connected to the drain of the second NMOSFET 307.

The transmission gate circuit of FIG. 3 also includes a node clamping circuit 308 connected between the nodal point 305 and ground (VSS). The node clamping circuit 308 comprises a second PMOSFET 309 and a third NMOSFET 310. The second PMOSFET 309 has a source terminal connected to the nodal point 305 and also to its body. A drain terminal of the second PMOSFET 309 is connected to a drain terminal of the third NMOSFET 310. A gate terminal of the second PMOSFET 309 is tied to the second bias voltage NW2. A source terminal of the third NMOSFET 310 is connected to ground (VSS) and to its body. A gate terminal of the third NMOSFET 310 is connected to an externally-generated enable signal 'ENABLE B' on line 311. The purpose and operation of the node clamping circuit 308 will be described below.

The gate biasing circuit 306, which supplies a gate bias voltage to the first PMOSFET 303, which comprises the pass gate 301 will now be described. A control circuit 312, which forms a first part of the gate biasing circuit 306, comprises a third PMOSFET 313, and a switching stage comprising a fourth NMOSFET 314 and a fifth NMOSFET 315. The third PMOSFET 313 has a source terminal connected to its body and biased at the first bias voltage NW. A drain terminal of the third PMOSFET 313 is connected to a drain terminal of the fourth NMOSFET 314 and to the gate terminal of the first PMOSFET 303 of the pass gate 301. A gate terminal of the third PMOSFET 313 serves as an input to the control circuit 312 and is connected to an output of a second part of the gate biasing circuit 306 to be described below. A gate terminal of the fourth NMOSFET 314 is tied to the second bias voltage NW2. A source terminal of the fourth NMOSFET 314 is connected to its body and to a drain terminal of the fifth NMOSFET 315. A source terminal of the fifth NMOSFET 315 is connected to its body and to ground (VSS). A gate terminal of the fifth NMOSFET 315 is connected to an externally-generated enable signal ENABLE where ENABLE is the inverse of ENABLE B so that when ENABLE is at a logical HIGH, ENABLE B is at a logical LOW and vice-versa. In one example, a logic HIGH may represent the VDD voltage level and a logic LOW may represent the ground (VSS) voltage level.

A level shifting circuit 316 comprises a second part of the gate biasing circuit 306 and provides, on its output line 317, an input to the gate terminal of the third PMOSFET 313. The level shifting circuit 316 comprises a fourth PMOSFET 318 having a source terminal connected to its body and to a source terminal of a fifth PMOSFET 319 and to the first bias voltage NW. The source terminal of the fifth PMOSFET 319 is also connected to its body. A gate terminal of the fourth PMOSFET 318 is connected to the output line 317 and to a drain terminal of the fifth PMOSFET 319. A drain terminal of fourth PMOSFET 318 is connected to a gate terminal of the fifth PMOSFET 319 and to a source terminal of a sixth PMOSFET 320. The source terminal of the sixth PMOSFET 320 is connected to its body. A gate terminal of the sixth PMOSFET 320 is biased at a voltage HFV. A seventh PMOSFET 321 has a gate terminal that also is biased at the voltage HFV and a source terminal connected to its body and to the output line 317. A drain terminal of the sixth PMOSFET 320 is connected to a drain terminal of a sixth NMOSFET 322. A gate terminal of the sixth NMOSFET 322 is tied to the second bias voltage NW2. A drain terminal of the seventh PMOSFET 321 is connected to a drain terminal of a seventh NMOSFET 323. A gate terminal of the seventh NMOSFET 323 is connected to the second bias voltage NW2. A source terminal of the sixth NMOSFET 322 is connected to its body and also to a drain terminal of an eighth NMOSFET 324. A source terminal of the seventh NMOSFET 323 is connected to a drain terminal of a ninth NMOSFET 325. A source terminal of the eighth NMOSFET 324 is connected to its body and to ground (VSS). A source terminal of the ninth NMOSFET 325 is connected to its body and to ground (VSS). A gate terminal of the eighth NMOSFET 324 is connected to the externally-generated enable signal ENABLE and a gate terminal of the ninth NMOSFET 325 is connected to the externally generated enable signal ENABLE B.

The level shifting circuit 316 acts as a level shifter circuit for the externally-generated enable signals. In order to control the "on/off" state of the third PMOSFET 313, the gate terminal of the third PMOSFET 313 must be toggled between the first bias voltage NW (to turn PMOSFET 313 off) and a certain voltage level below the first bias voltage NW voltage (to turn PMOSFET 313 on). The level shifter circuit 316 translates the ENABLE and ENABLE B signals from a low voltage domain (for example, the VDD domain) into the voltage domain of the first bias voltage NW bias supply. The sixth and seventh PMOSFET devices 320 and 321 with their gates connected to the HFV node act as cascade devices and ensure that the fourth, fifth and third PMOSFET devices 318, 319 and 313, respectively, are always biased within their safe voltage operating regime if the input voltage at the pad 304 (e.g. 15V) exceeds the maximum safe operating voltage of individual MOSFET devices (e.g., 9V). The sixth and seventh NMOSFET devices 322 and 323 respectively with their gates connected to the second bias voltage NW2 act as cascade devices and ensure that the eighth and ninth NMOSFET devices 324 and 325 respectively are always biased within their safe voltage operating regime if the input voltage at the pad 304 (e.g., 15V) exceeds the maximum safe operating voltage of individual MOSFET devices (e.g., 9V). In a preferred embodiment, the bias voltage HFV equals approximately half of the voltage at the pad 304.

In operation, in one mode, when the ENABLE signal is low (VSS/ground, for example), the gate of the third PMOSFET 313 will be lower than the first bias voltage NW level and therefore the third PMOSFET 313 will be turned on. Consequently, the first PMOSFET 303 will be off because its gate voltage will be switched to the first bias voltage NW level by the third PMOSFET 313. If the voltage at the pad 304 exceeds the second bias voltage NW2, the first NMOSFET 302, whose gate terminal is biased at the second bias voltage NW2, will break the signal path between the pad 304 and the nodal point 305. Therefore, in this mode of operation, the voltage at the nodal point 305 will effectively be limited to a level below the second bias voltage NW2, which protects the second NMOSFET 307 and the node clamping circuit 308 from over-voltage stress.

In a second mode of operation, when the ENABLE signal is high (VDD for example), the gate of the third PMOSFET 313 will be at the first bias voltage NW level and therefore the third PMOSFET 313 will be turned off due to its gate to source voltage being zero Volts. With the ENABLE signal high, the fifth NMOSFET 315 will be turned on and will switch the gate of the first PMOSFET 303 to ground (VSS) via the fourth NMOSFET 314, which serves as a cascade device to protect the fifth NMOSFET 315 from over-voltage if the input voltage at the pad 304 exceeds the maximum safe operating voltage of individual MOSFET devices. Consequently, the first PMOSFET 303 and the pass gate 301 will be turned on. In this second mode, the transmission gate circuit of FIG. 3 will support a true open drain mode of operation while the pad 304 is acting as an input/output pad.

With reference to the node clamping circuit 308, in a transient mode of operation, a high voltage input (for example, 15 Volts) at the pad 304 can typically toggle between 0 Volts and 15 Volts. As a result, the voltage level at the nodal point 305 may be elevated to a level that is higher than the safe operational range of the second NMOSFET 307. This is due to capacitive coupling from the pad 304 to the nodal point 305 via the first NMOSFET and PMOSFET devices 302 and 303 comprising the pass gate 301. By the action of the second PMOSFET 309 and the third NMOSFET 310, the nodal point 305 will be limited to a voltage level equal to the bias voltage NW2+VTH, where VTH refers to a threshold voltage of a MOSFET device. In one example, this voltage level is equal to 7.5+0.7 Volts for a 15V pad input.

In one embodiment, the transmission gate circuit of FIG. 3 can be built with a type of device rated for a given first maximum voltage (e.g., 9 Volts) yet the circuit can function satisfactorily up to an input voltage level (on the pad 304) of almost twice the first maximum voltage (e.g., 15V). Advantageously, the transmission gate circuit of FIG. 3 also supports a true open-drain input mode, which means that if the pad 304 is used as an input/output pad for devices operating with a power supply (e.g., 3.3 Volts) that is below the first maximum voltage, the input voltage range on the pad 304 (e.g., 5.5 Volts) can exceed the power supply voltage and can be as high as the first maximum voltage without causing damage to any components of the circuit and without causing voltage contention issues that could result in excessive DC leakage current.

In one embodiment, the enable signal can be provided by blowing a fuse after programming. In another embodiment the enable signal can be received from a control circuit such as in a core of an integrated circuit that includes the circuitry of FIG. 3. Such an enable signal can be programmed by a core register to allow switching between the two modes of transmission gate operation.

In one embodiment, the bias voltages NW, NW2 and HFV can be provided by a bias voltage generation circuit that uses the pad voltage and the VDD input/output supply voltage to provide safe well bias voltages for all of the MOSFETs. That is, the NW, NW2 and HFV voltage levels depend on the pad and VDD voltage levels. These bias voltages are also used to obtain safe bias voltages for internal nodes of the transmission gate circuit in order to protect the individual MOSFET devices from exceeding their maximum safe operating voltage ranges. A suitable bias voltage generating circuit will now be described with reference to FIG. 4.

Figure 4:
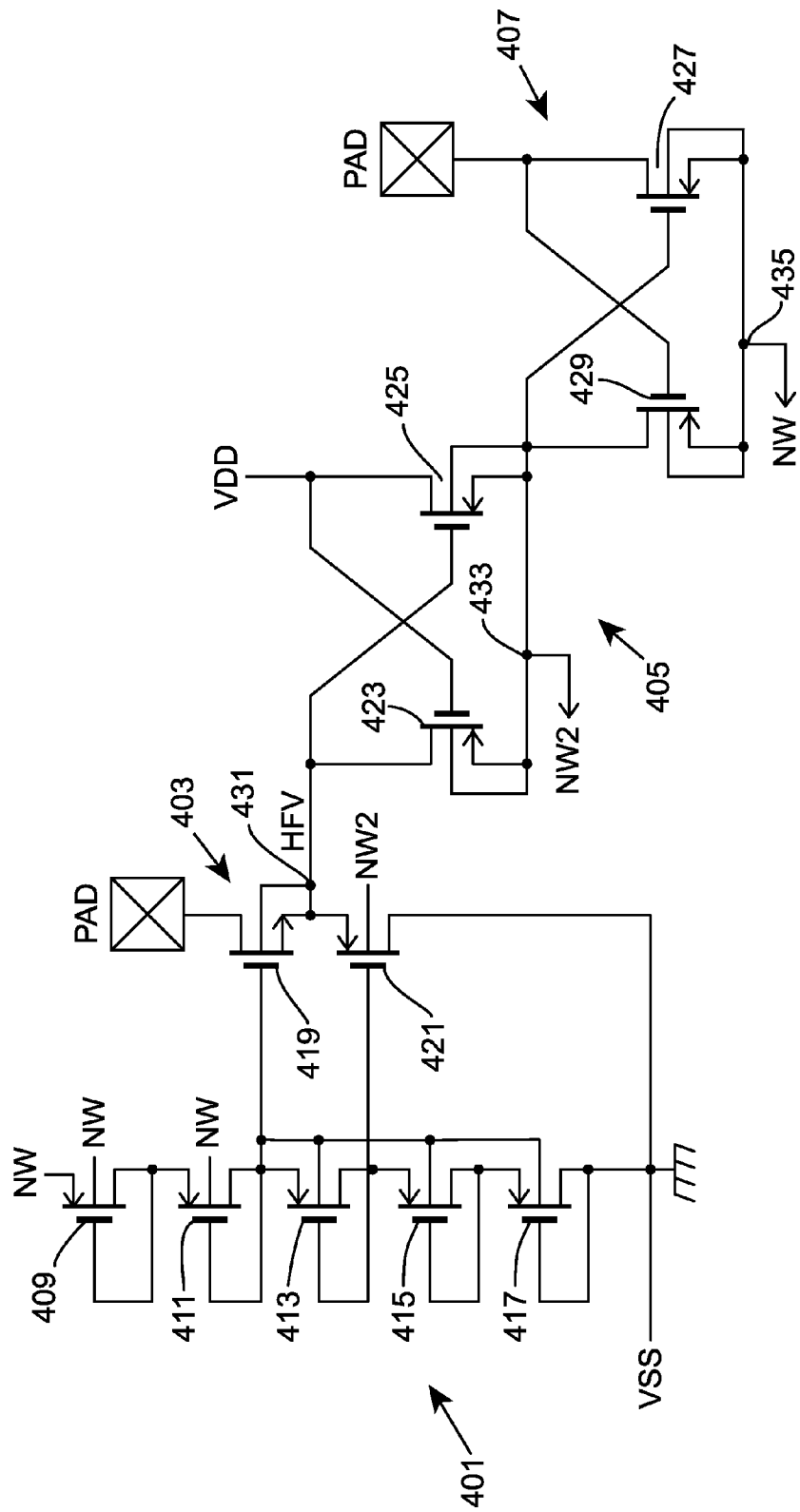
FIG. 4 is a schematic circuit diagram of a conventional bias voltage generating circuit suitable for use with the transmission gate circuit of FIG. 3.

Referring now to FIG. 4, which illustrates a known bias voltage generating circuit suitable for use with the transmission gate circuit of FIG. 3, a voltage divider stage 401 includes PMOSFETs 409, 411, 413, 415, and 417. Each of the PMOSFETs 409-417 has its gate connected to its drain. The bodies of the PMOSFETs 409 and 411 are biased to the first bias voltage NW and the source of the PMOSFET 409 is connected to the first bias voltage NW. The bodies of the PMOSFETs 413, 415, and 417 are tied to the source of the PMOSFET 413. The voltage divider stage 401 is used to linearly divide the first bias voltage NW into lower voltages.

Output taps from the voltage divider stage 401 are coupled to an impedance buffer stage 403. The impedance buffer stage 403 comprises two transistors 419 and 421. The first transistor 419 is a NMOSFET transistor with a drain coupled to the pad 304 of FIG. 3 and its body and source tied to a node 431. The second transistor 421 is a PMOSFET with its source tied to the node 431, its drain tied to VSS (ground), and its body tied to the second bias voltage NW2.

The body of the first transistor 419 is connected to its source so that when the voltage on the pad 304 is at a relatively high voltage (e.g., above 9 Volts in one embodiment), the drain to body junction of the first transistor 419 is within its safe operating voltage area. The first and second transistors 419 and 421 are implemented in source follower configurations to generate a voltage (HFV, meaning 'half voltage') at the node 431 that is approximately one half of the voltage on the pad 304.

The bias voltage generating circuit also includes first and second well bias circuits 405 and 407. The first well bias circuit 405 includes PMOSFETS 423 and 425 and the second well bias circuit 407 includes PMOSFETS 427 and 429. The first well bias circuit 405 has its first input coupled to the node 431 and the second input coupled to VDD, which in this example is 3.3 Volts. The second well bias circuit 407 has a first input coupled to an output node 433 of the first well bias circuit 405 and the second input coupled to the pad 304. Each of the well bias circuits 405, 407 provides at its output, the higher of the voltages of its inputs. The first well bias circuit 405 thus provides at its output node 433 the second bias voltage NW2, which is the higher of VDD or the voltage at the node 431 (HFV, which is approximately half of the voltage on the pad 304). The second well bias circuit 407 provides at its output node 435 the first bias voltage NW, which is the higher of NW and the voltage on the pad. This effectively means that the first bias voltage NW is the higher of VDD or the voltage on the pad as will be explained below.

When the voltage on the pad is greater than VDD, then the second bias voltage NW2 is always less than the pad voltage. Consequently, the output node 435 of the second well bias circuit 407 will always provide a bias voltage (NW) equal to the pad voltage in such a condition. However, when the pad voltage is equal to or less than VDD, the output node 433 (NW2) of the first well bias circuit 405 will equal VDD. Accordingly, even though the inputs to the second well bias circuit 407 are at the second bias voltage NW2 and the pad voltage, the well bias circuit 407 effectively provides at its output node 435 (NW) the greater of the voltages of VDD and the pad voltage. However, by using the second bias voltage NW2 as an input to the second well bias circuit 407 instead of VDD, the transistors 427 and 429 stay within their safe operating voltage areas even when the pad voltage is at a relatively high voltage (e.g., above 9 Volts). When the pad voltage is at a relatively high voltage, (say above 9 Volts) the other input (NW2) to the circuit 407 is at half of the pad voltage. Thus, the voltage across transistors 427 and 429 is only half the pad voltage. Hence transistors 427 and 429 will not be over-stressed under such an operating condition. If the circuit 407 were to include a VDD (e.g., 3.3 Volts) terminal as an input, then the transistors would be overstressed if the pad voltage were raised to a relatively very high voltage, e.g., 15 Volts.

Thus, the bias voltages HFV, NW and NW2 required by the transmission gate circuitry of FIG. 3 are generated by well bias voltage generation circuitry of FIG. 4. In the flash memory characterization mode, when the pad voltage is set, typically at 15 Volts, the bias voltage NW equals the pad voltage and the bias voltage NW2 is equal to half the pad voltage. In normal pull up or pull down and output low modes, NW is equal to NW2 and both equal VDD (typically 3.3 Volts). In a true open drain mode, when the pad voltage is at 5.5 Volts, the bias voltage NW is equal to the pad voltage (5.5 Volts) and the bias voltage NW2 is equal to VDD. This because in this example where the pad voltage equals 5.5 Volts and VDD equals 3.3 Volts, the bias voltage NW2 will be 3.3 Volts, 3.3 Volts being greater than half of 5.5 Volts.

In the embodiments shown or described herein, the control circuitry and transmission gates and other switching devices are implemented with MOSFETS. However, other embodiments may be implemented with other types of transistors including the transmission gates implemented with other types of switching devices.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice-versa.

Also for example, in one embodiment, the illustrated examples may be implemented as circuitry located on a single integrated circuit or within a same device. Further, the entire functionality of the circuitry shown in FIGS. 3 and 4 may be implemented in an integrated circuit. Alternatively, the examples may be implemented as any number of separate integrated circuits or separate devices interconnected with each other in a suitable manner.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A transmission gate circuit, comprising:
   an input node and an output node (I/O SIGNAL);
   a first switching device having a first electrode coupled to the input node, a second electrode coupled to a nodal point, and a control electrode;
   a switching stage having a first electrode coupled to the control electrode of the first switching device, a control electrode for receiving a first enable signal ENABLE, and a second electrode for connection to a first reference voltage VSS;
   a second switching device having a first electrode coupled to the control electrode of the first switching device, a second electrode for receiving a first bias voltage NW, and a third electrode for receiving a control signal; and
   a clamping circuit operably coupled to the nodal point for, when enabled, limiting the voltage level at the nodal point to a value equal to a sum of a second bias voltage NW2, and a threshold voltage, wherein the clamping circuit comprises:
      a fourth switching device having a first electrode, a second electrode coupled to the nodal point, and a control electrode for receiving the second bias voltage NW2; and
      a fifth switching device having a first electrode coupled to the first electrode of the fourth switching device, a second electrode for receiving the first reference voltage VSS, and a control electrode for receiving a second enable signal,
   wherein when the first enable signal and the control signal are in a first state, the second switching device is off and the switching stage is on, pulling the control electrode of the first switching device to the first reference voltage VSS, and turning on the first switching device, thereby providing a conductive path between the input node and the nodal point, and
   wherein when the first enable signal and the control signal are in a second state, the switching stage is off and the second switching device is on, pulling the control electrode of the first switching device to the first bias voltage NW, thereby putting the first switching device in a non-conductive state.

2. The transmission gate of claim 1, further comprising a protection device, including:
   a third switching device having a first electrode coupled to the output node, a second electrode coupled to the nodal point, and a control electrode connected to a supply voltage VDD,
   wherein the third switching device provides a conductive path between the nodal point and the output node when the voltage at the nodal point is at or below the supply voltage VDD, and isolates the nodal point from the output node when the voltage at the nodal point is above the level of the supply voltage VDD.

3. The transmission gate circuit of claim 2, wherein the third switching device is a natural device comprising a NMOSFET (N-channel Metal Oxide Semiconductor Field Effect Transistor) having a negligible threshold voltage.

4. The transmission gate circuit of claim 1, wherein the fourth switching device comprises a P-channel metal oxide semiconductor field effect transistor (PMOSFET) and the fifth switching device comprises an N-channel MOSFET (NMOSFET) and wherein drain terminals of the fourth and fifth switching devices are connected to one another, a source terminal of the fourth switching device is connected to the nodal point, and a source terminal of the fifth switching device is connected to the first reference voltage VSS.

5. The transmission gate circuit of claim 1, further comprising a sixth switching device having a first electrode coupled to the input node, a second electrode coupled to the nodal point, and a control electrode for receiving the second bias voltage NW2, wherein the sixth switching device isolates the input node from the nodal point when a voltage level at the input node exceeds the second bias voltage NW2.

6. The transmission gate circuit of claim 5, wherein the sixth switching device comprises an N-channel metal oxide semiconductor field effect transistor (NMOSFET).

7. The transmission gate circuit of claim 1, further comprising:
   a bias voltage generating circuit for generating the first bias voltage NW, the second bias voltage NW2, and a third bias voltage HFV, each derived from a voltage level at the input node and from a second reference voltage, wherein the bias voltage generating circuit has a first input coupled to the input node and a second input for receiving the second reference voltage.

8. The transmission gate circuit of claim 7, wherein:
   the first bias voltage NW is equal to the higher of the voltage at the input node, and the second reference voltage, the second bias voltage NW2 is equal to the higher of half the voltage at the input node, and the second reference voltage, and the third bias voltage HFV is equal to half the voltage at the input node.

9. The transmission gate circuit of claim 1, further comprising a level shifting circuit for providing the control signal at an output terminal thereof, wherein the control signal is derived from the first enable signal.

10. The transmission gate circuit of claim 1, wherein:

the switching stage comprises first and second NMOSFETs (N-channel Metal Oxide Semiconductor Field Effect Transistor), wherein the first NMOSFET has a drain terminal connected to the control electrode of the first switching device, a gate terminal that receives a second bias voltage NW2, and a source terminal connected to a transistor body of the first NMOSFET and to a drain terminal of the second NMOSFET, and wherein the second NMOSFET has a source terminal connected to its transistor body and to the first reference voltage VSS, and a gate terminal that receives the first enable signal.

11. The transmission gate circuit of claim 1, wherein the first switching device comprises a P-channel metal oxide semiconductor field effect transistor (PMOSFET), wherein the control electrode comprises a gate terminal of the PMOSFET, a drain terminal of the PMOSFET is connected to the input node, and a source terminal of the PMOSFET is connected to the nodal point.

12. A transmission gate circuit, comprising:

an input node and an output node (I/O SIGNAL);

a first switching device having a first electrode coupled to the input node, a second electrode coupled to a nodal point, and a control electrode;

a switching stage having a first electrode coupled to the control electrode of the first switching device, a control electrode for receiving a first enable signal ENABLE, and a second electrode for connection to a first reference voltage VSS;

a second switching device having a first electrode coupled to the control electrode of the first switching device, a second electrode for receiving a first bias voltage NW, and a third electrode for receiving a control signal; and a level shifting circuit for providing the control signal at an output terminal thereof, wherein the control signal is derived from the first enable signal, wherein when the first enable signal and the control signal are in a first state, the second switching device is off and the switching stage is on, pulling the control electrode of the first switching device to the first reference voltage VSS, and turning on the first switching device, thereby providing a conductive path between the input node and the nodal point, wherein when the first enable signal and the control signal are in a second state, the switching stage is off and the second switching device is on, pulling the control electrode of the first switching device to the first bias voltage NW, thereby putting the first switching device in a non-conductive state, wherein the level shifting circuit comprises:

seventh, eighth, ninth, tenth, eleventh, twelfth, thirteenth and fourteenth switching devices, wherein:

the seventh switching device has a first electrode connected to a first electrode of the eighth switching device and to the first bias voltage NW, a control electrode connected to the output terminal, and a second electrode connected to a control electrode of the eighth switching device and to a first electrode of the ninth switching device, the eighth switching device has a second electrode connected to the output terminal, control electrodes of the ninth and tenth switching devices are both connected to a third biasing voltage HFV, the ninth switching device has a second electrode connected to a first electrode of the eleventh switching device, the tenth switching device has a first electrode connected to the output terminal, and a second electrode connected to a first electrode of the twelfth switching device, control electrodes of the eleventh and twelfth switching device are connected to the second bias voltage NW2, the eleventh switching device has a second electrode connected to a first electrode of the thirteenth switching device, the twelfth switching device has a second electrode connected to a first electrode of the fourteenth switching device, second electrodes of the thirteenth and fourteenth switching devices are connected to the first reference voltage VSS, the thirteenth switching device has a control electrode that receives the first enable signal, and the fourteenth switching device has a control electrode that receives the second enable signal.

13. A transmission gate circuit, comprising:

a pass gate connected between an input node and a nodal point;

a control circuit having an output connected to the pass gate, wherein the control circuit comprises:

a first switch having a first electrode connected to a first bias voltage NW;

a second switch having a first electrode connected to a second electrode of the first switch, and a control electrode that receives a second bias voltage NW2;

a third switch having a first electrode connected to a second electrode of the second switch, a second electrode connected to a first reference voltage VSS, and a control electrode that receives a first enable signal ENABLE;

a level shifting circuit, connected between the first bias voltage NW and the first reference voltage VSS, that generates a control signal, wherein the control signal is derived from the first enable signal and is provided to a control electrode of the first switch of the control circuit; and a clamping circuit connected between the nodal point and the first reference voltage VSS, wherein the clamping circuit, when enabled, limits the voltage level at the nodal point to a value equal to a sum of a second bias voltage NW2, and a threshold voltage.

14. The transmission gate circuit of claim 13, wherein the pass gate comprises:

a first NMOSFET (N-channel metal oxide semiconductor field effect transistor) having a drain terminal connected to the input node, a source terminal connected to the nodal point and a gate terminal that receives a second bias voltage NW2; and a first PMOSFET (P-channel MOSFET) having a drain terminal connected to the input node and the drain terminal of the first NMOSFET, a source terminal connected to the nodal point and the source terminal of the first NMOSFET, and a gate connected to the output of the control circuit.

15. The transmission gate circuit of claim 14, further comprising a protection device having a first electrode coupled to an output node, a second electrode coupled to the nodal point, and a control electrode connected to a supply voltage VDD, wherein the protection device provides a conductive path between the nodal point and the output node when the voltage at the nodal point is at or below the supply voltage VDD, and isolates the nodal point from the output node when the voltage at the nodal point is greater than the supply voltage VDD.

16. The transmission gate circuit of claim 15, wherein the protection device comprises a second NMOSFET having a source terminal connected to the nodal point, a drain terminal connected to the output node for providing an output signal, and a gate terminal connected to the supply voltage VDD.

17. The transmission gate circuit of claim 16, wherein the clamping circuit comprises:
a second PMOSFET having a source terminal connected to its body terminal and to the nodal point, and a gate terminal that receives the second bias voltage; and
a third NMOSFET having a drain terminal connected to a drain terminal of the second PMOSFET, a source terminal connected to its body and to the first reference voltage VSS, and a gate electrode that receives an inverted version of the enable signal.

18. The transmission gate of claim 17, wherein the first switch comprises a third PMOSFET, the second switch comprises a fourth NMOSFET and the third switch comprises a fifth NMOSFET, wherein:
the third PMOSFET has a source terminal connected to a body of the third PMOSFET and to the first bias voltage NW;
the fourth NMOSFET has a drain terminal connected to a drain terminal of the third PMOSFET, and a gate terminal that receives the second bias voltage NW2;
the fifth NMOSFET has a drain terminal connected to a source terminal of the fourth NMOSFET and a body of the fourth NMOSFET, a source terminal connected to a body of the fifth NMOSFET and to the first reference voltage VSS, and a gate terminal that receives the first enable signal ENABLE.

19. The transmission gate circuit of claim 18, wherein the level shifting circuit comprises:
a fourth PMOSFET having a source terminal connected to its body and that receives the first bias voltage NW;
a fifth PMOSFET having a source terminal connected to its body and to the source terminal of the fourth PMOSFET, a drain terminal connected to a gate terminal of the fourth PMOSFET, and a gate terminal connected to a drain terminal of the fourth PMOSFET;
a sixth PMOSFET having a source terminal connected to its body and to the drain terminal of the fourth PMOSFET;
a seventh PMOSFET having a source terminal connected to its body and to the drain terminal of the fifth PMOSFET, wherein the control signal is generated at a node connected the drain of the fifth PMOSFET and the source of the seventh PMOSFET, and a gate terminal connected to a gate terminal of the sixth PMOSFET;
a sixth NMOSFET having a drain terminal connected to a drain terminal of the sixth PMOSFET;
a seventh NMOSFET having a drain terminal connected to a drain terminal of the seventh PMOSFET, and a gate terminal connected to a gate terminal of the sixth NMOSFET and to the second bias voltage NW2;
an eighth NMOSFET having a drain terminal connected to a source terminal and a body of the sixth NMOSFET, a source electrode connected to a body of the eighth NMOSFET and the first reference voltage VSS, and a gate electrode that receives the first enable signal; and
a ninth NMOSFET having a drain terminal connected to a source terminal and a body of the seventh NMOSFET, a source terminal and a body connected to the first reference voltage VSS, and a gate electrode that receives the inverted version of the first enable signal.

* * * * *